United States Patent
Glass et al.

(10) Patent No.: US 10,510,848 B2
(45) Date of Patent: Dec. 17, 2019

(54) SUB-FIN SIDEWALL PASSIVATION IN REPLACEMENT CHANNEL FINFETS

(71) Applicant: INTEL CORPORATION, Santa Clara, CA (US)

(72) Inventors: Glenn A. Glass, Portland, OR (US); Ying Pang, Portland, OR (US); Anand S. Murthy, Portland, OR (US); Tahir Ghani, Portland, OR (US); Karthik Jambunathan, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/576,150

(22) PCT Filed: Jun. 24, 2015

(86) PCT No.: PCT/US2015/037326
§ 371 (c)(1),
(2) Date: Nov. 21, 2017

(87) PCT Pub. No.: WO2016/209219
PCT Pub. Date: Dec. 29, 2016

(65) Prior Publication Data
US 2018/0151677 A1 May 31, 2018

(51) Int. Cl.
*H01L 29/40* (2006.01)
*H01L 21/8238* (2006.01)
(Continued)

(52) U.S. Cl.
CPC .... *H01L 29/408* (2013.01); *H01L 21/823807* (2013.01); *H01L 21/823814* (2013.01);
(Continued)

(58) Field of Classification Search
CPC .................................................. H01L 29/408
(Continued)

(56) References Cited

U.S. PATENT DOCUMENTS

| 9,178,067 B1* | 11/2015 | Ching | H01L 29/0607 |
| 2010/0207208 A1* | 8/2010 | Bedell | B82Y 10/00 |
| | | | 257/346 |

(Continued)

FOREIGN PATENT DOCUMENTS

| EP | 2775528 A1 | 9/2014 |
| WO | 2016209219 A1 | 12/2016 |

OTHER PUBLICATIONS

International Search Report and Written Opinion received for PCT/US2015/037326. dated Mar. 24, 2016, 13 pages.
(Continued)

*Primary Examiner* — Igwe U Anya
(74) *Attorney, Agent, or Firm* — Finch & Maloney PLLC

(57) ABSTRACT

Techniques are disclosed for reducing off-state leakage of fin-based transistors through the use of a sub-fin passivation layer. In some cases, the techniques include forming sacrificial fins in a bulk silicon substrate and depositing and planarizing shallow trench isolation (STI) material, removing and replacing the sacrificial silicon fins with a replacement material (e.g., SiGe or III-V material), removing at least a portion of the STI material to expose the sub-fin areas of the replacement fins, applying a passivating layer/treatment/agent to the exposed sub-fins, and re-depositing and planarizing additional STI material. Standard transistor forming processes can then be carried out to complete the transistor device. The techniques generally provide the ability to add arbitrary passivation layers for structures that are grown in STI-based trenches. The passivation layer inhibits sub-fin source-to-drain (and drain-to-source) current leakage.

20 Claims, 10 Drawing Sheets

(51) Int. Cl.
*H01L 29/423* (2006.01)
*H01L 27/092* (2006.01)
*H01L 29/786* (2006.01)
*H01L 29/10* (2006.01)
*H01L 29/775* (2006.01)
*H01L 29/06* (2006.01)
*H01L 29/08* (2006.01)
*H01L 29/16* (2006.01)
*H01L 29/20* (2006.01)
*H01L 29/66* (2006.01)
*H01L 29/78* (2006.01)
*H01L 21/02* (2006.01)

(52) U.S. Cl.
CPC ............ *H01L 21/823821* (2013.01); *H01L 21/823878* (2013.01); *H01L 27/0924* (2013.01); *H01L 29/0653* (2013.01); *H01L 29/0847* (2013.01); *H01L 29/1054* (2013.01); *H01L 29/16* (2013.01); *H01L 29/20* (2013.01); *H01L 29/42392* (2013.01); *H01L 29/6681* (2013.01); *H01L 29/66795* (2013.01); *H01L 29/775* (2013.01); *H01L 29/7851* (2013.01); *H01L 29/78696* (2013.01); *H01L 21/02178* (2013.01); *H01L 21/02181* (2013.01); *H01L 21/02183* (2013.01); *H01L 21/02186* (2013.01); *H01L 21/02189* (2013.01); *H01L 21/02192* (2013.01); *H01L 21/02194* (2013.01)

(58) Field of Classification Search
USPC .......................................... 257/195
See application file for complete search history.

(56) References Cited

U.S. PATENT DOCUMENTS

| | | |
|---|---|---|
| 2010/0301390 A1 | 12/2010 | Ko et al. |
| 2011/0169101 A1* | 7/2011 | Doornbos ......... H01L 29/66795 257/394 |
| 2013/0285141 A1 | 10/2013 | Kuo et al. |
| 2014/0027860 A1 | 1/2014 | Glass et al. |
| 2014/0213037 A1* | 7/2014 | LiCausi ............ H01L 21/76224 438/429 |
| 2014/0252475 A1 | 9/2014 | Xu |
| 2014/0291726 A1 | 10/2014 | Pillarisetty et al. |
| 2014/0374838 A1* | 12/2014 | Chen .................... H01L 27/0886 257/401 |
| 2015/0102386 A1 | 4/2015 | Chen et al. |
| 2015/0129932 A1* | 5/2015 | Lin ....................... H01L 27/092 257/192 |
| 2018/0108750 A1* | 4/2018 | Glass .............. H01L 21/823821 |

OTHER PUBLICATIONS

International Preliminary Report on Patentability received for PCT/US2015/037326. dated Jan. 4, 2018, 10 pages.
Extended European Search Report issued for Application No. 15896512.9, dated Jan. 15, 2019. 7 pages.

* cited by examiner

US 10,510,848 B2

SUB-FIN SIDEWALL PASSIVATION IN REPLACEMENT CHANNEL FINFETS

BACKGROUND

A FinFET is a transistor built around a thin strip of semiconductor material (generally referred to as the fin). The transistor includes the standard field-effect transistor (FET) nodes, including a gate, a gate dielectric, a source region, and a drain region. The conductive channel of the device resides on the outer sides of the fin beneath the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). There are a number of non-trivial performance issues associated with fin-based transistors.

DETAILED DESCRIPTION

Figure 1:
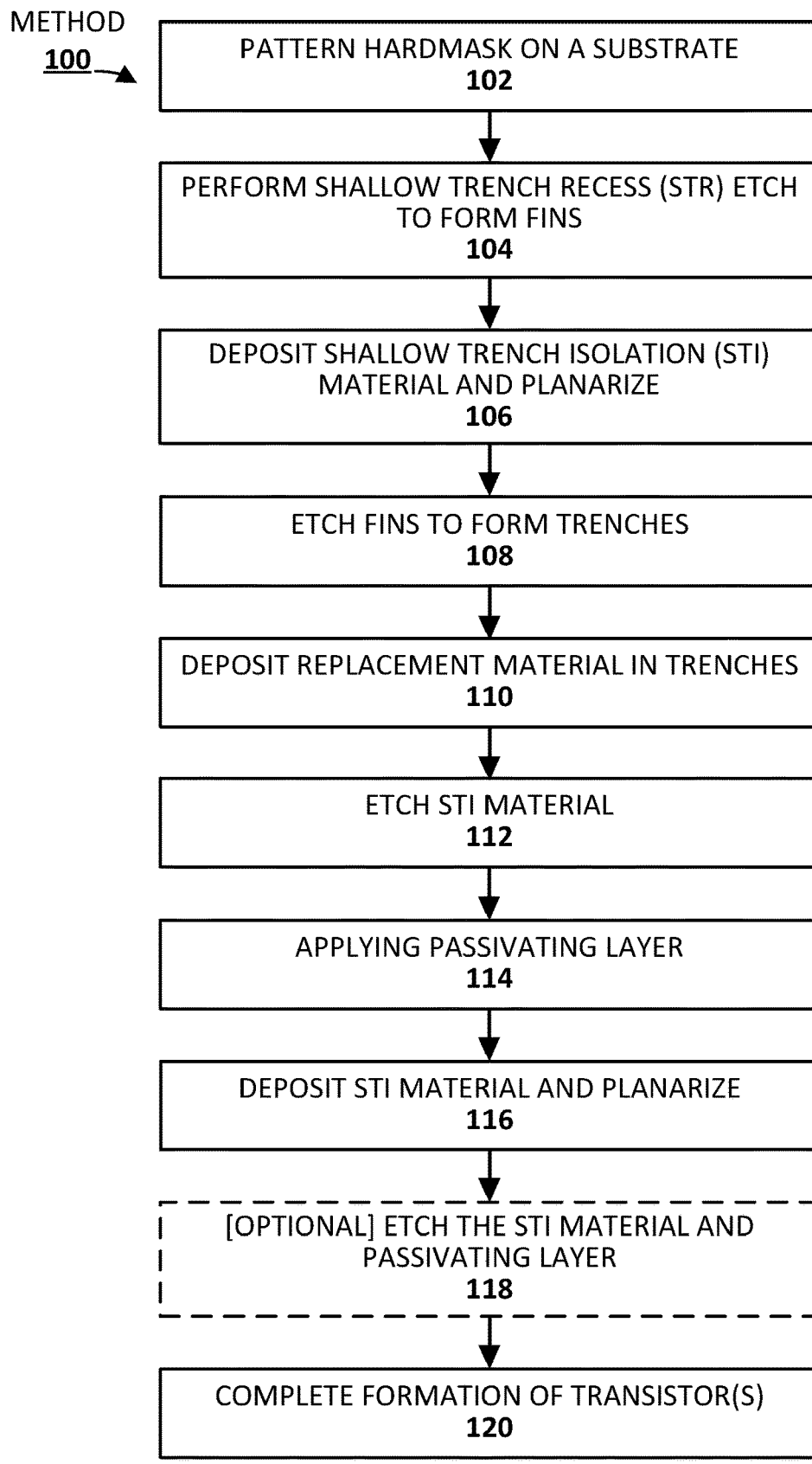
FIG. 1 illustrates a method of forming an integrated circuit, in accordance with various embodiments of the present disclosure.

Techniques are disclosed for reducing off-state leakage of fin-based transistors, through the use of a sub-fin passivation layer. The techniques may include, for example, passivating sub-fin sidewalls in transistors formed by aspect ratio trapping (ART) or similar integration schemes where non-silicon channel materials are substituted in for sacrificial silicon fins. In accordance with an embodiment, the techniques include forming sacrificial fins in a substrate and depositing and planarizing a shallow trench isolation (STI) material, removing and replacing the sacrificial fins with a replacement material, removing at least a portion of the STI material to expose the sub-fin areas of the replacement fins, applying a passivating layer/treatment/agent to the exposed sub-fins (and possibly other areas of the structure), and re-depositing and planarizing additional STI material. Standard transistor forming processes (e.g., STI recess, gate stack formation, source/drain formation, contact formation) can then be carried out to complete the transistor device. As will be appreciated in light of this disclosure, the techniques generally provide the ability to add arbitrary passivation layers for structures that are grown in STI-based trenches. For example, in the case of a silicon (Si) substrate, non-Si material (e.g., silicon germanium, germanium, and III-V materials) can be used to replace the sacrificial Si fins while still allowing for passivation of the replacement fins to reduce interface trap density (Dit) and improve source-to-drain leakage. Numerous variations and configurations will be apparent in light of this disclosure.

General Overview

Silicon (Si) has useful properties that have kept it in high volume production for semiconductor devices. One such property is the ability of silicon dioxide to passivate a Si surface. Passivation in the context of Si includes that the interface trap density (fixed charge) and impurity induced charge (often mobile) can both be maintained low, such as on the order of 1E11 charges per $cm^2$, for example. Recently, non-Si channel semiconductor devices have gained an increased interest. For example, Si channel regions are being replaced by silicon germanium (SiGe) and III-V materials. However, the fixed and mobile charge densities of such SiGe and III-V replacement material channels can be hundreds or even thousands of times higher than when native Si channel material is used for Si substrates. This can lead to very large off-state currents due to high source-to-drain leakage, and thereby degrade performance or make such devices including replacement material channels nonviable. In more detail, FinFETs or tri-gate devices have a sub-channel region continuous with the fin. This permits a conduction path for parasitic off-state source-to-drain (and drain-to-source) current leakage for the FinFET as well as channel-to-substrate parasitic capacitance.

Thus, and in accordance with one or more embodiments of the present disclosure, techniques are disclosed for reducing sub-fin leakage in fin-based transistors including replacement material channels. This reduction in leakage current is accomplished through the use of a sub-fin passivation layer. The techniques may include, for example, passivating sub-fin sidewalls in transistors formed by aspect ratio trapping (ART) or similar integration schemes where non-silicon channel materials are substituted in for sacrificial silicon fins. Note that as used herein, "aspect ratio trapping" and "ART" generally include the techniques(s) of causing defects in a material to terminate on a side surface as the material grows vertically, such as non-crystalline/dielectric sidewalls, where the sidewalls are sufficiently high relative to the size of the growth area so as to trap most, if not all, of the defects. In other words, ART generally uses replacement channel techniques that include the formation of fins, removal of the fins to form STI trenches that are approximately the width of a single fin, and then depositing the replacement material in the approximately single fin width STI trenches. Accordingly, the ART process can allow for the growth of nominally defect free channel layers (which may include regions that later become source/drain and channel portions of a transistor). However, the problem of sub-fin leakage remains. To this end, the techniques variously described herein resolve such an issue by removing (either completely or partially) the STI material post-deposition of the replacement channel material, thereby affording an opportunity to perform passivation on the replacement channel material fins before reprocessing the STI layer. The passivation techniques may be used to chemically neutralize and/or physically protect the replacement material fins, for example. For example, the passivating material layer may reduce the mobile charge density that permits flow of current, particularly with respect to source-to-drain (or drain-to-source) leakage through ART sub-fin sidewalls in the channel region, and more specifically, under the transistor channel (the transistor channel being the portion of the replacement material in contact with the gate). In other words, the passivating layer, in some embodiments, is located at the interface of the replacement material and the STI sidewall.

In some embodiments, the replacement material may be Si and the passivating layer material may be at least one of silicon dioxide and silicon nitride. In some embodiments, the replacement material may be one of SiGe and germanium (Ge) and the passivating layer material may be at least one of Si, aluminum oxide, aluminum nitride, and yttrium. In some embodiments, the replacement material may be at least one III-V material and the passivating layer material may be at least one of aluminum oxide, hafnium oxide, and sulfur. In any such embodiments, the substrate may be, for example, a bulk silicon substrate or some other suitable bulk substrate. In some embodiments, the passivation layer material that is initially deposited is designed to be consumed in a subsequent oxidation process (or otherwise oxidized), such as in the case of passivating SiGe replacement material with Si or yttrium. In some embodiments, the passivation layer material is intended to be robust as a protective layer against further oxidation, such as in the case of aluminum oxide, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate for passivating SiGe, Ge, or III-V replacement materials. In some embodiments, the passivating layer material may be selected such that the density of interface traps (Dit) is reduced in the channel region, and more specifically, under the transistor channel (the transistor channel being the portion of the replacement material in contact with the gate). In other words, the passivating layer, in some embodiments, is located at the interface of the replacement material and the STI sidewall. In such an example, the passivating layer can improve source-to-drain (or drain-to-source) leakage through the sub-fin sidewall(s). In some embodiments, the passivating layer material may be selected to address the issue of broken bonds and/or impurities of replacement material fins. In some embodiments, only the channel regions of fins formed may be replaced and only such channel regions may be passivated using the techniques variously described herein.

In a standard ART flow, there is generally no opportunity to add a passivating material between the replacement channel material and the STI material. Therefore, the techniques variously described herein provide that opportunity by removing (either completely or partially) the STI material after the replacement material fins have been formed to allow for passivation of the replacement material. Without the passivation layer/treatment, transistors formed using ART processing and replacement material channel regions may have high source-to-drain (or drain-to-source) leakage. Such leakage can cause off-state current to be significantly high (e.g., at least three orders of magnitude higher than in structures including the passivating material layer). Further, the sub-fin portion in an ART geometry transistor would have the semiconductor channel region in direct contact with the STI material if no passivating agent/layer/treatment is present, causing unacceptably high off-stat leakage current. Such leakage in structures without the passivating material layer may cause non-viability or otherwise degraded performance due to the high off-state current not providing a sufficient change relative to the on-state current.

Upon analysis (e.g., using scanning/transmission electron microscopy (SEM/TEM), composition mapping, secondary ion mass spectrometry (SIMS), atom probe imaging, 3D tomography, etc.), a structure or device configured in accordance with one or more embodiments will effectively show a passivating layer as variously described herein. For example, in some cases, the passivating layer may be located between the replacement channel material and a shallow trench isolation (STI) material, as will be apparent in light of the structures discussed herein. Further, in some cases, the passivating layer may be located between the substrate and the STI material, and in some cases, portions of the passivating layer may be sandwiched between two STI material layers, as will be described in more detail below. In addition, in some cases, the passivating layer may be located in the channel region and source/drain regions of a transistor formed using the techniques described herein. In other cases, the passivating layer may be located only in the channel region of transistors formed using the techniques described herein. In some cases, the techniques may be detected by observing the improvement gained in off-state current due to a reduction in source-to-drain (or drain-to-source) leakage as a result of the inclusion of a passivating layer variously described herein. Numerous configurations and variations will be apparent in light of this disclosure.

Architecture and Methodology

FIG. 1 illustrates a method 100 of forming an integrated circuit, in accordance with one or more embodiments of the present disclosure. FIGS. 2A-L illustrate example integrated circuit structures that are formed when carrying out method 100 of FIG. 1, in accordance with various embodiments. As will be apparent in light of the structures formed, method 100 discloses techniques for forming a passivating layer in the channel region of a transistor. The passivating layer can provide numerous benefits, as variously described herein. The structures of FIGS. 2A-L are primarily depicted and described herein in the context of forming finned transistor configurations (e.g., FinFET or tri-gate), for ease of illustration. However, the techniques can be used to form transistors of any suitable geometry or configuration, depending on the end use or target application. For example, FIG. 3A illustrates an example integrated circuit structure including a nanowire configurations, as will be discussed in more detail below. Various example transistor geometries that can benefit from the techniques described herein include, but are not limited to, field-effect transistors (FETs), metal-oxide-semiconductor FETs (MOSFETs), tunnel-FETs (TFETs), planar configurations, finned configurations (e.g., fin-FET, tri-gate), and nanowire (or nanoribbon or gate-all-around) configurations. In addition, the techniques may be used to form CMOS transistors/devices/circuits, where either or both of the included p-MOS and n-MOS transistors may benefit from a passivating layer variously described herein, for example.

Figure 2A:
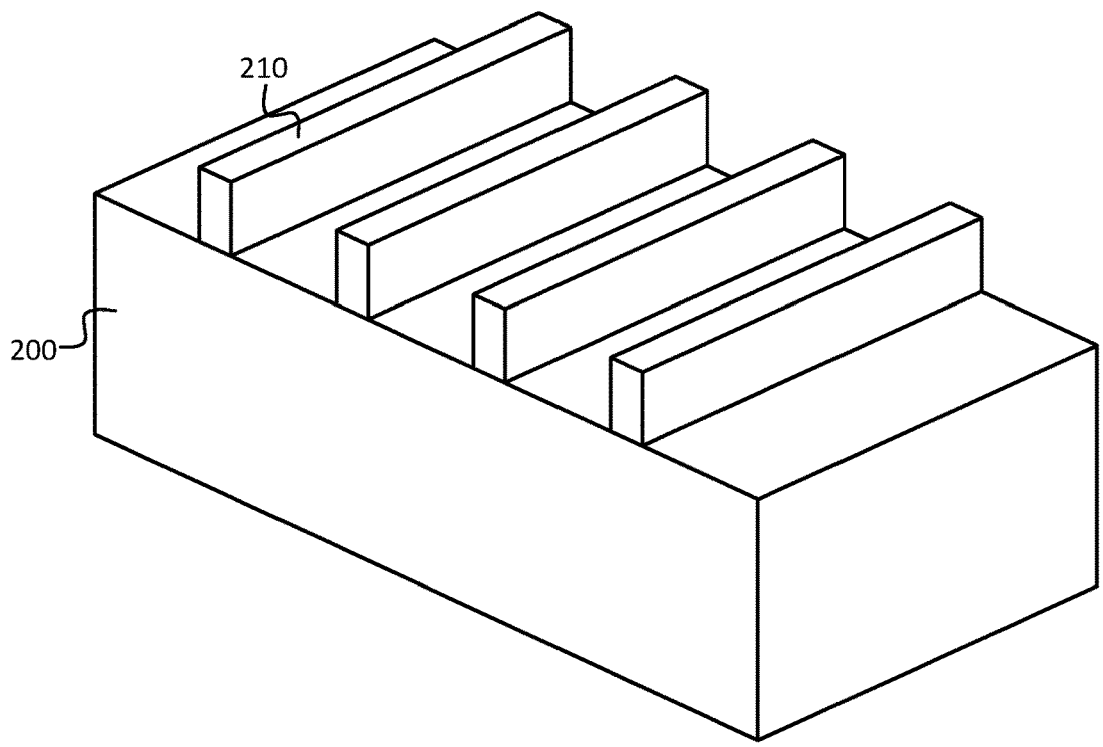
FIGS. 2A-L illustrate example structures that are formed when carrying out the method of FIG. 1, in accordance with various embodiments of the present disclosure.
Figure 3A:
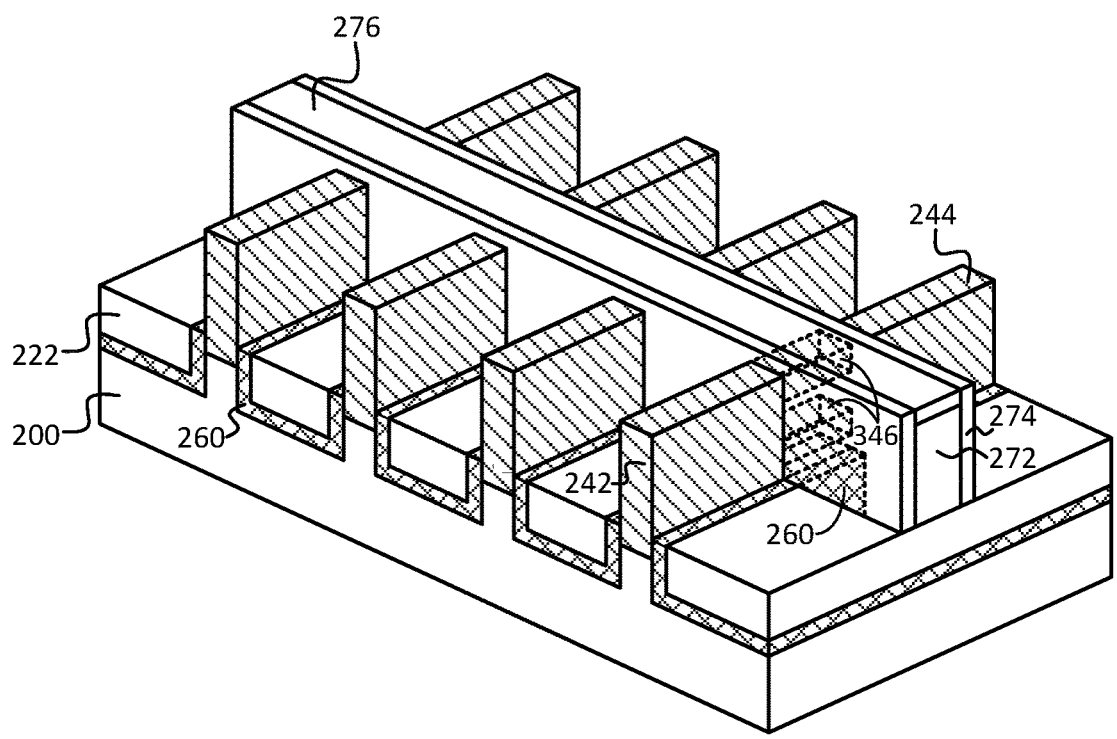
FIGS. 3A-C illustrate variations on the structure of FIG. 2L formed using the method of FIG. 1, in accordance with various embodiments of the present disclosure.

As can be seen in FIG. 1, method 100 includes patterning 102 hardmask 210 on a substrate 200 to form the example resulting structure shown in FIG. 2A, in accordance with an embodiment. In some embodiments, substrate 200 may be: a bulk substrate including, e.g., Si, SiGe, Ge, and/or at least one III-V material; an X on insulator (XOI) structure where X is Si, SiGe, Ge, and/or at least one III-V material and the insulator material is an oxide material or dielectric material or some other electrically insulating material; or some other suitable multilayer structure where the top layer includes Si, SiGe, Ge, and/or at least one III-V material. Hardmask 210 on substrate 200 can be deposited using any suitable technique. For example, hardmask 210 may be blanket deposited or grown on substrate 200 using chemical vapor deposition (CVD), atomic layer deposition (ALD), physical vapor deposition (PVD), spin-on processing, and/or any other suitable process to form hardmask 210 on substrate 200. In some instances, the surface of substrate 200 to be deposited on may be treated (e.g., chemical treatment, thermal treatment, etc.) prior to deposition of hardmask 210. Hardmask 210 can be patterned 102 using any suitable techniques, such as one or more lithography and etch processes, for example. Hardmask 210 may be comprised of any suitable material, such as various oxide or nitride materials, for example. Specific oxide and nitride materials may include silicon oxide, titanium oxide, hafnium oxide, aluminum oxide, or titanium nitride, just to name a few. In some cases, the hardmask 210 material may be selected based on the substrate 200 material used.

Figure 2B:
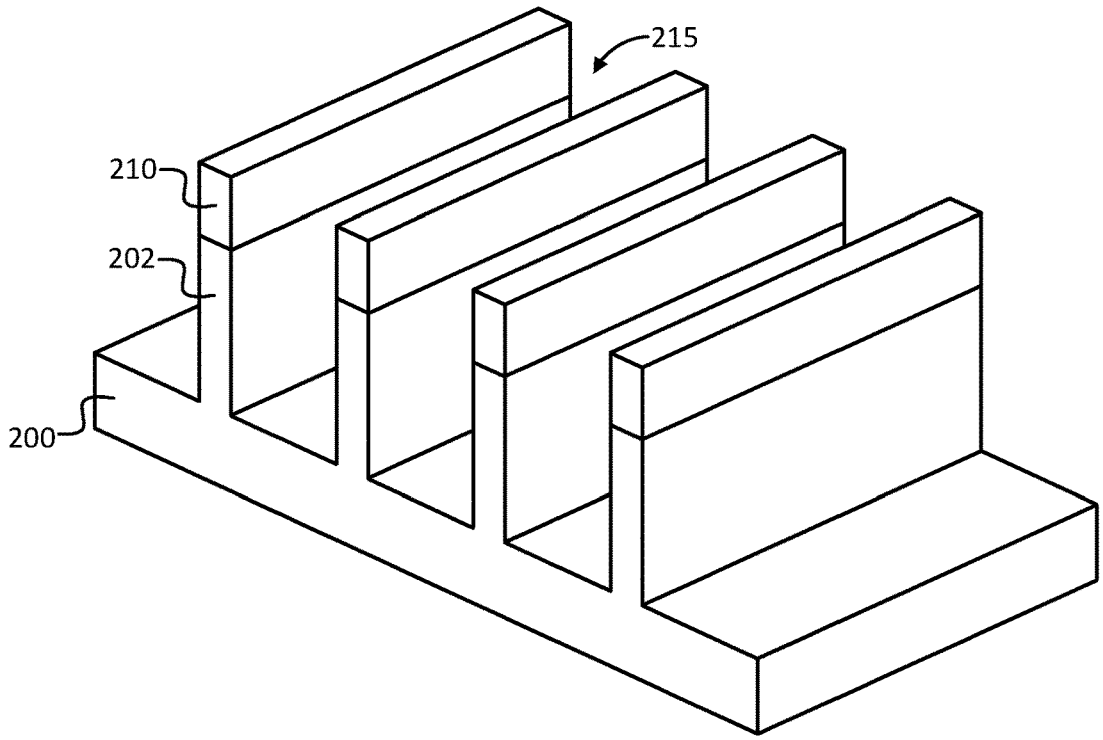

Method 100 of FIG. 1 continues with performing 104 shallow trench recess (STR) etch to form fins 202 from substrate 200, thereby forming the resulting example structure shown in FIG. 2B, in accordance with an embodiment. The STR etch 104 used to form trenches 215 and fins 202 may include any suitable techniques, such as various masking processes and wet and/or dry etching processes, for example. In some cases, STR etch 104 may be performed in-situ/without air break, while in other cases, STR etch 104 may be performed ex-situ. Trenches 215 may be formed with varying widths and depths based on the end use or target application. For example, multiple hardmask patterning 102 and etching 104 processes may be performed to achieve varying depths in the STR trenches 215. Fins 202 may be formed to have varying widths and heights. For example, in an aspect ratio trapping (ART) integration scheme, the fins may be formed to have particular height to width ratios such that when they are later removed or recessed, the resulting trenches formed allow for defects in the replacement material deposited to terminate on a side surface as the material grows vertically, such as non-crystalline/dielectric sidewalls, where the sidewalls are sufficiently high relative to the size of the growth area so as to trap most, if not all, of the defects. In such an example case, the height to width ratio (h/w) of the fins may be greater than 1, such as 1.5 to 3, for example. Note that the trenches 215 and fins 202 are shown as having the same width and depth/height in this example structure for ease of illustration; however, the present disclosure is not intended to be so limited. Further note that although four fins 202 are shown in the example structure, any number of fins may be formed, such as one, two, ten, hundreds, thousands, millions, etc., depending on the end use or target application.

Figure 2C:
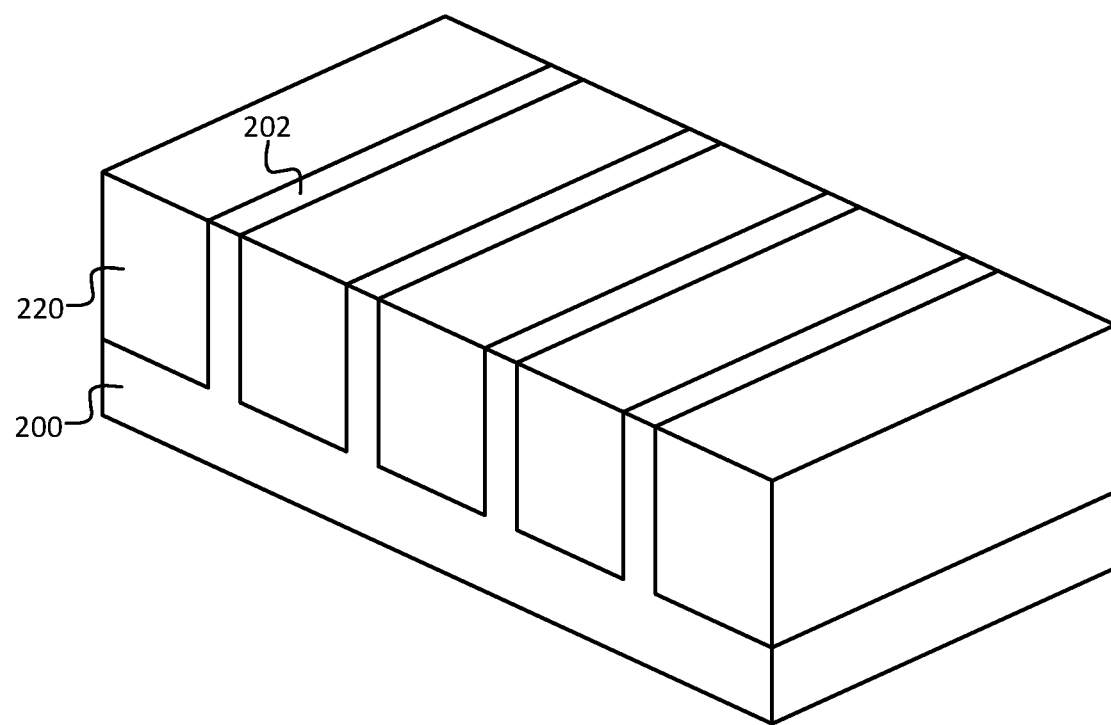

Method 100 of FIG. 1 continues with depositing 106 shallow trench isolation (STI) material 220 and planarizing to form the resulting example structure shown in FIG. 2C, in accordance with an embodiment. In some embodiments, deposition 106 of STI material 220 may include any deposition process described herein (e.g., CVD, ALD, PVD, etc.), or any other suitable deposition process. STI material 220 may include any suitable insulating material, such as one or more dielectric, oxide (e.g., silicon dioxide), or nitride (e.g., silicon nitride) materials. In some embodiments, the STI material 220 may selected based on the substrate material 200. For example, in the case of a Si substrate 200, STI material 220 may be silicon dioxide or silicon nitride. Recall that the passivation techniques variously described herein include a first STI material deposition, removal or recess (e.g., partial removal) of that first STI material, coating with a passivating material, and then depositing a second STI material to reprocess the STI layer. Therefore, in this example embodiment, deposition 106 is the first STI material deposition, which will be subsequently removed or recessed, as discussed in more detail below. Note that although the passivation techniques include first and second STI material depositions, the STI material used for each deposition may comprise the same materials or different materials, depending on the particular configuration.

Figure 2D:
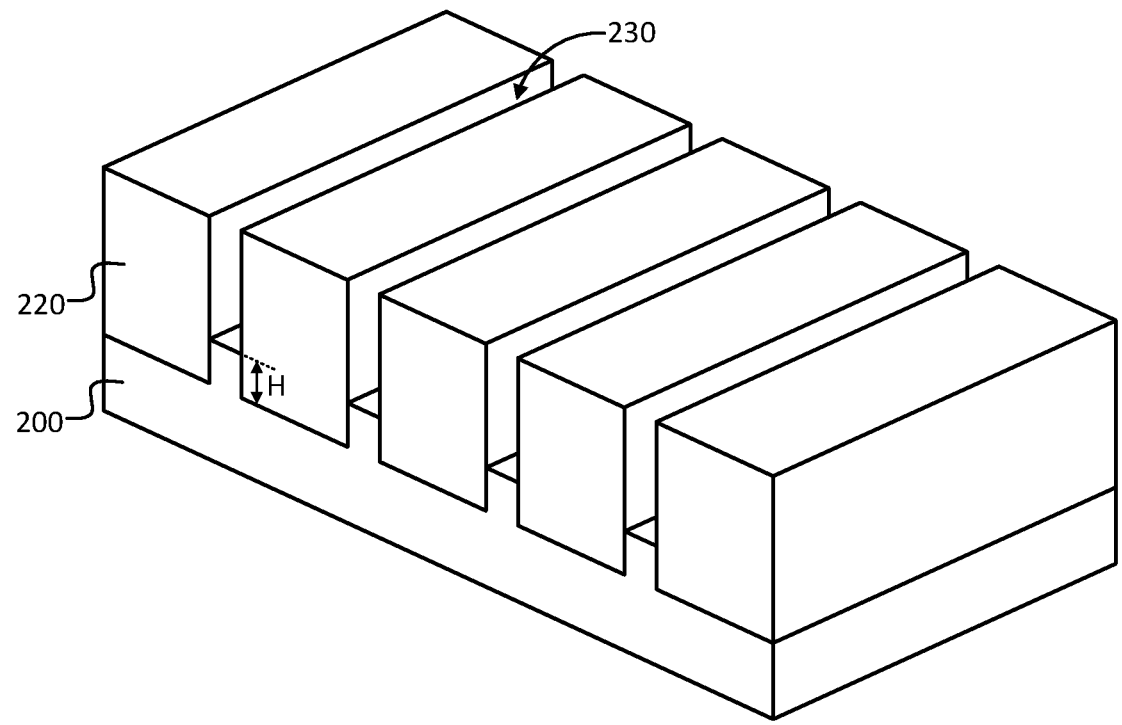

Method 100 of FIG. 1 continues with etching 108 fins 202 to form trenches 230, thereby forming the resulting example structure shown in FIG. 2D, in accordance with an embodiment. Etch 108 may be performed using any suitable techniques, such as various masking processes and wet and/or dry etching processes, for example. The etch 108 performed in this example embodiment caused a recess of fins 202, such that a portion of the bottom of fins 202 (which were formed from substrate 200 and are comprised of the same native material) having a height H are still present between the STI material 220. In some embodiments, etch 108 may cause the removal of the entirety of fins 202, such that H is 0, or etch 108 may be performed such that it removes material below the bottom of the STI layer 220 and into the substrate 200, for example. Trenches 230 can be used for the deposition of a replacement material, as will be discussed in more detail below. Note that during ART processing, trenches 230 may include high aspect ratio openings, to trap dislocations, for example, preventing the dislocations from reaching the epitaxial film surface, and greatly reducing the surface dislocation density within the trenches 230.

Figure 2E:
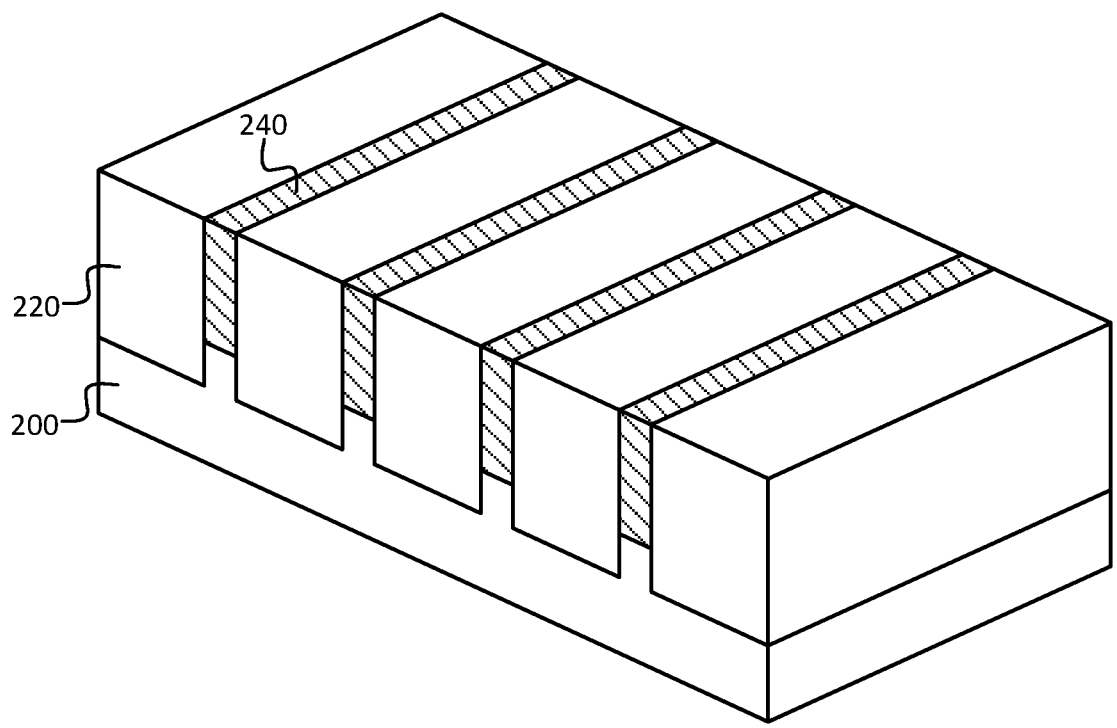

Method 100 of FIG. 1 continues with depositing 110 replacement material 240 in trenches 230 and planarizing to form the resulting example structure shown in FIG. 2E, in accordance with an embodiment. Deposition 110 can be followed by a planarization process to, for example, address protruding facets where present. Deposition 110 may be performed using any deposition process described herein (e.g., CVD, ALD, LPE, PVD, MBE, etc.), or any other suitable deposition process. In some cases, deposition 110 may be performed in-situ/without air break, while in other cases, deposition 110 may be performed ex-situ. In some cases, the deposition 110 techniques used may depend upon the material 240 being deposited. As can be seen in the structure of FIG. 2E, deposition 110 forms fins including replacement material 240. As will be discussed in more detail below, replacement material 240 fins can be used for the formation of one or more transistors, where the fins 240 are used to form the channel region of the transistor(s), and in some cases, also used to form the source and drain regions of the transistor(s).

In some embodiments, replacement material 240 may include any suitable semiconductor material different from the substrate material 200. For example, replacement material 240 may be Si, SiGe, Ge, and/or at least one III-V material. In some embodiments, substrate 200 may be Si and replacement material 240 may be SiGe, Ge, and/or at least one III-V material. For example, in embodiments where replacement material 240 is $Si_{1-x}Ge_x$, x may range from 0.01 to 1 (e.g., 0.2<x<0.8, to provide an example range). Therefore, in some embodiments, the replacement material may be Ge by itself or as a layer in the SiGe material (e.g., if the SiGe was deposited in a graded manner with increasing Ge content). In another example embodiment, the replacement material 240 may be one or more III-V materials. Example III-V materials, as variously used herein, can include gallium arsenide (GaAs), indium phosphide (InP), indium arsenide (InAs), indium gallium arsenide (InGaAs), aluminum arsenide (AlAs), or indium aluminum arsenide (InAlAs), or any other suitable III-V material. In some embodiments, if replacement material 240 is one or more III-V replacement materials, the material may include a single layer or a multilayer stack of III-V materials, such as InP/InGaAs/InAs, GaAs/InP/InAs, GaAs/InGaAs/InAs, GaAs/InAlAs/InAs, InP/InGaAs/InP, GaAs/InAs, GaAs/InGaAs, or InP/InGaAs, or any other suitable multilayer stack including two or more III-V materials. In some such embodiments where replacement material 240 is a III-V multilayer stack, a high bandgap III-V material may be used near the bottom of the stack (e.g., to help reduce leakage current to ground), such as GaAs, InP, InAlAs, or AlAs, for example. Further, in some such embodiments, a III-V multilayer stack may employ a low bandgap III-V material near the top of the stack (e.g., to help with making contact to the stack), such as InAs or InGaAs, for example. The materials discussed herein may be strained and/or doped in any suitable manner depending on the end use or target application.

Figure 2F:
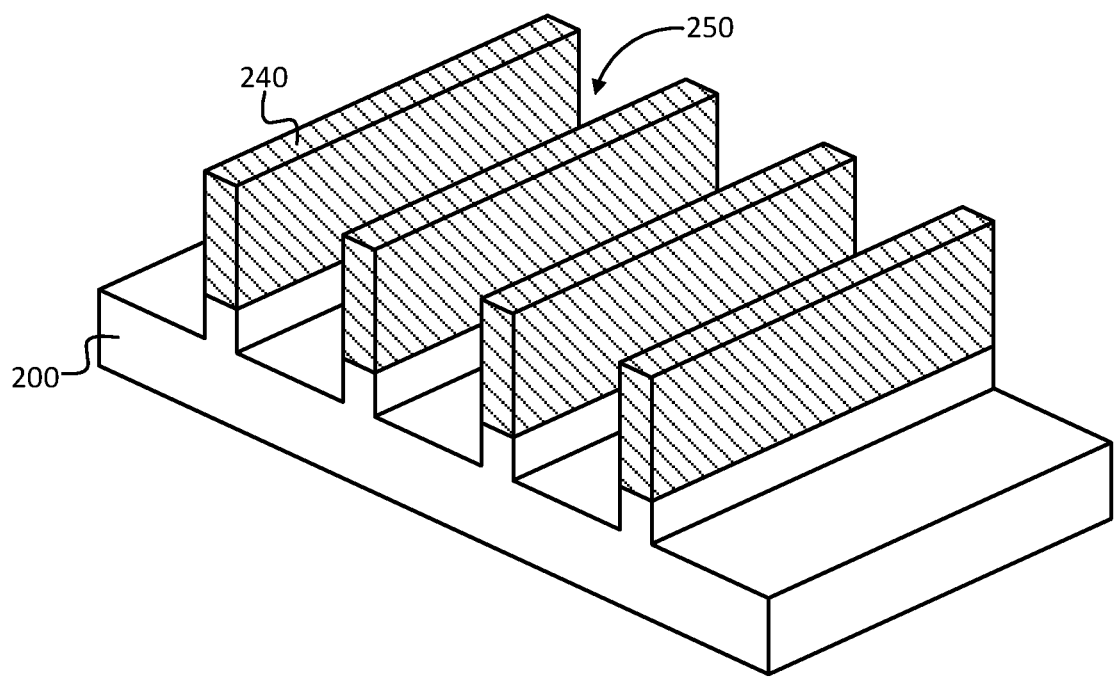

Method 100 of FIG. 1 continues with etching 112 STI material 220 to form trenches 250, thereby forming the resulting example structure shown in FIG. 2F, in accordance with an embodiment. Etch 112 may include any suitable technique, such as various masking processes and wet and/or dry etching processes, for example. In some cases, etch 112 may be performed in-situ/without air break, while in other cases, etch 112 may be performed ex-situ. In some embodiments, etch 112 may completely remove the first STI material 220 that was deposited, as is the case with the example embodiment illustrated by the structure of FIG. 2F. In other embodiments, etch 112 may only recess or partially remove the first STI material 220, leaving a portion of the material at the bottom of trenches 250, as will be discussed in more detail with reference to FIG. 2K', for example.

Figure 2G:
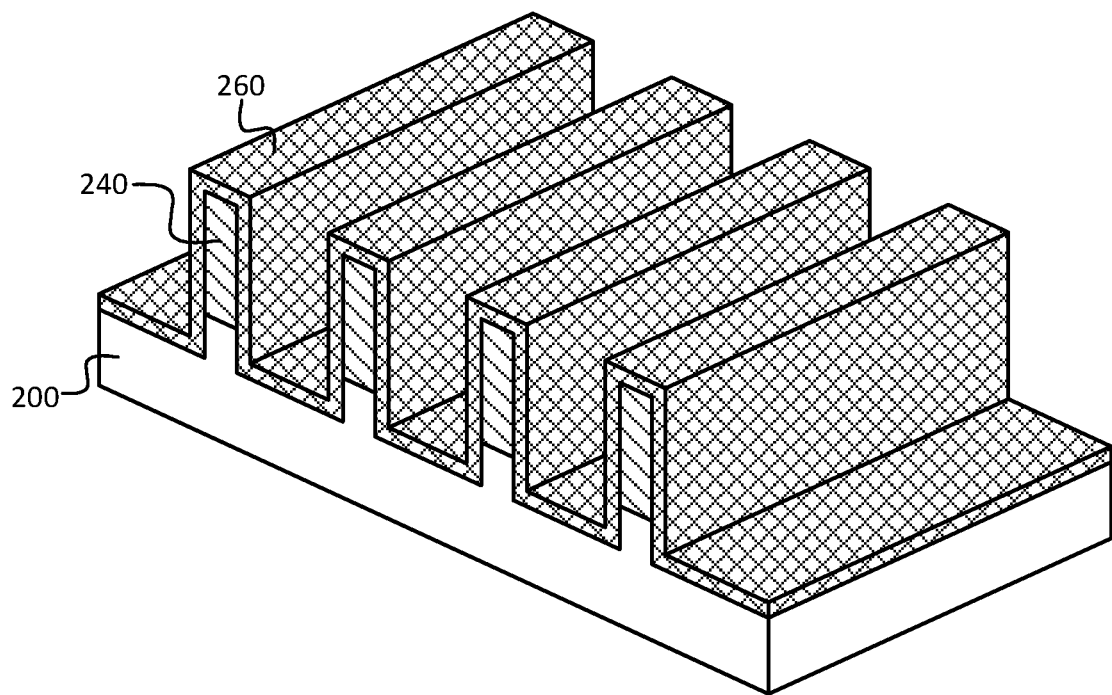

Method 100 of FIG. 1 continues with applying 114 passivating layer 260 to form the resulting example structure shown in FIG. 2G, in accordance with an embodiment. Application 114 may be performed using any deposition process described herein (e.g., CVD, ALD, LPE, PVD, MBE, etc.), thermal evaporation techniques, or any other suitable deposition process. In some cases, application 114 may be performed in-situ/without air break, while in other cases, application 114 may be performed ex-situ. In some cases, the application 114 techniques used may depend upon the material 260 being deposited. Note that although application 114 is discussed herein as depositing a passivating layer 260, application 114 may include and/or alternatively consist of other passivation techniques, such as a applying a passivating agent or treatment to the structure of FIG. 2F. Therefore, although passivating layer 260 is depicted as a distinct layer in the example embodiment of FIG. 2G, application 114 (or the particular passivation process used) may only or also cause a physical and/or chemical change at the surface of the exposed layers (e.g., at the surface of replacement material fins 240 and/or substrate 200). In other words, passivation layer 260 may be detectable as a portion of the outside walls of replacement material fins 240 instead of being a distinct layer as shown in FIG. 2G, for example. However, in FIG. 2G, passivation layer 260 is depicted as a single layer, and such a single layer may include the same material throughout or have one or more components graded throughout the layer from a first concentration to a second concentration. Also note that although passivation layer 260 is depicted as a single layer, passivation application 114 may include a plurality of passivation layers 260, depending on the end use or target application.

Figure 2H:
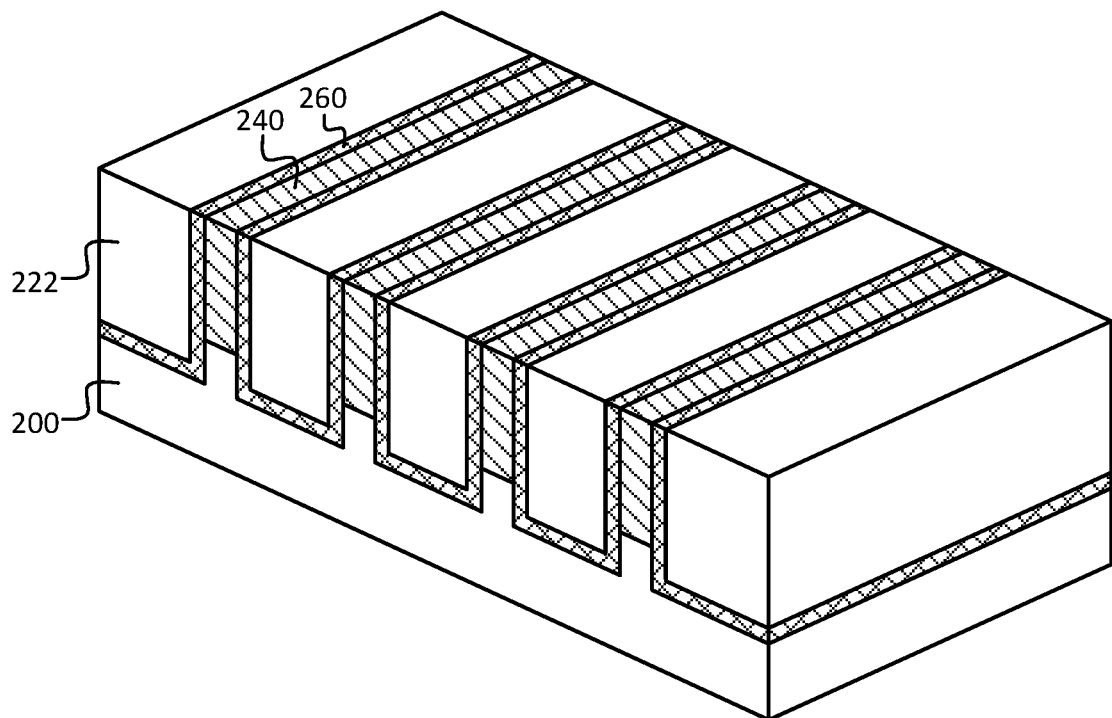

Method 100 of FIG. 1 continues with depositing 116 second STI material 222 and planarizing, to form the resulting example structure shown in FIG. 2H, in accordance with an embodiment. As can be seen, the second STI material fills the portion of the trenches 250 that still existed after passivating layer 260 was deposited. Deposition 116 may be performed using any deposition process described herein (e.g., CVD, ALD, PVD, spin-on processing, etc.), or any other suitable deposition process. In some cases, deposition 116 may be performed in-situ/without air break, while in other cases, deposition 116 may be performed ex-situ. Recall that although STI material 222 is referred to as the second STI material, it may include the same material as the first STI material 220. Accordingly, the first and second designations are intended to refer to the order in which they are deposited during method 100. Therefore, the STI material may be re-deposited 116 if the second STI material 222 is the same as the first STI material 220. However, in some embodiments, the first and second STI materials 220 and 222 may be different. As can also be seen in FIG. 2H, after the planarization process, at least one surface of the replacement material 240 fins may be exposed (e.g., the top surface in this example case) and the passivating layer 260 is located between the at least a portion of the replacement material fins 240 and the second STI material 222. Also note that the passivating layer 260 is located between the substrate 200 and the second STI material 222.

In some embodiments, passivating layer 260 may have any arbitrary or desired thickness, such as a thickness of 1-10 nm, or some other suitable thickness depending on the end use or target application. In some embodiments, passivating layer 260 may be deposited to have a substantially conformal growth pattern. Such a substantially conformal growth pattern may include that the thickness of a portion of the passivating layer 260 between the replacement material fins 240 and second STI material 222 may is substantially the same (e.g., within 1 or 2 nm tolerance) as the thickness of a portion of the passivating layer between the substrate 200 and the second STI material 222, for example.

In some embodiments, passivating layer 260 may include any suitable material that is different from the second STI material 222. In some embodiments, the passivating layer 260 material used may be selected based on the second STI material 222 used. In some embodiments, the passivating layer 260 may be selected based on the replacement material 240 deposited during process 110. For example, passivating layer 260 may be selected such that the density of interface traps (Dit) is reduced in the sub-channel (or sub-fin) region of a resulting transistor(s) formed using the techniques described herein. In such an example, the passivating layer can improve source-to-drain (or drain-to-source) leakage through the sub-fin sidewall(s) in the channel region, and more specifically, under the transistor channel (the transistor channel being the portion of the replacement material in contact with the gate). In other words, the passivating layer, in some embodiments, is located at the interface of the replacement material and the STI sidewall. Accordingly, the passivating layer 260 material may be selected to address the issue of broken bonds and/or impurities of replacement material fins 240. In embodiments where the replacement material 240 is Si, the passivating material 260 may include silicon nitride and/or silicon dioxide. In embodiments where the replacement material 240 is SiGe or Ge, the passivating material 260 may include Si, aluminum oxide, aluminum nitride, and/or yttrium. In embodiments where the replacement material 240 is one or more III-V materials, the passivating material 260 may include aluminum oxide, hafnium oxide, and/or sulfur (e.g., InGaAs replacement material and a sulfur passivation material). Numerous other replacement material 240 and passivating material 260 combinations will be apparent in light of this disclosure. In some embodiments, the passivation layer material 260 that is initially deposited is designed to be consumed in a subsequent oxidation process (or otherwise oxidized), such as in the case of applying Si or yttrium on SiGe replacement material. In some embodiments, the passivation layer material 260 is intended to be robust as a protective layer against further oxidation, such as in the case of aluminum oxide or hafnium oxide (or other suitable materials having a high dielectric constant K) for III-V replacement materials.

Figure 2I:
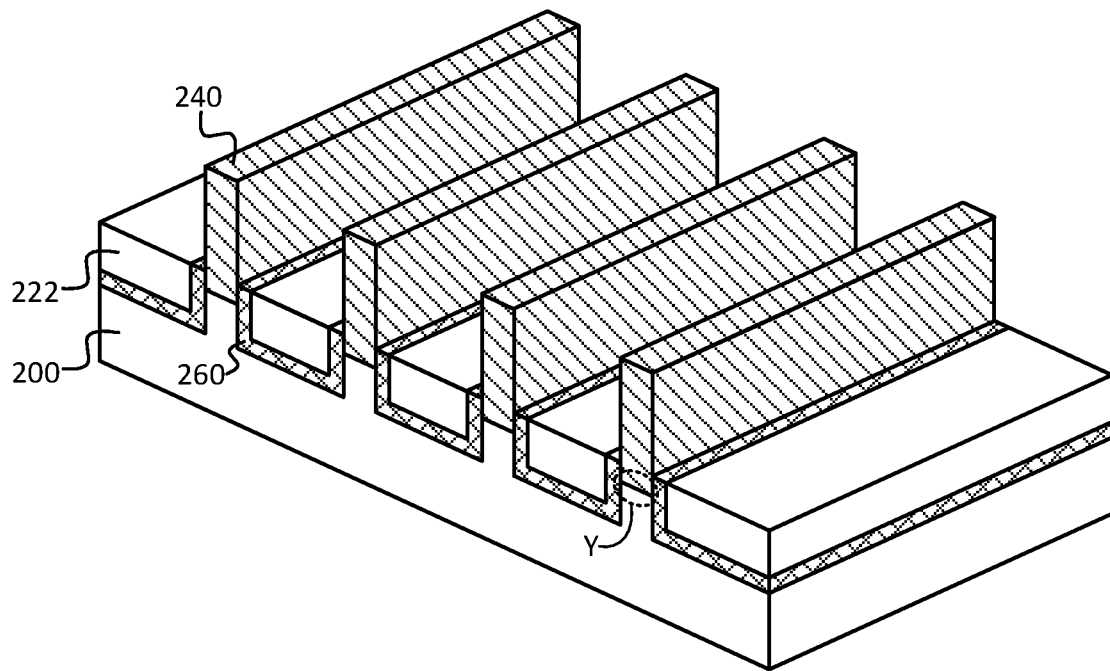

Method 100 of FIG. 1 optionally continues with etching 118 the STI material 222 and passivating layer 260, to form the resulting example structure shown in FIG. 2I, in accordance with an embodiment. Etch 118 may be performed using any suitable techniques, such as various masking processes and wet and/or dry etching processes, for example. In some cases, etch 118 may be performed in-situ/ without air break, while in other cases, etch 118 may be performed ex-situ. In this example embodiment, etch 118 removes second STI material 222 and passivating layer 260 such that replacement material fin 240 protrudes from the plane, which can be performed for fabricating transistors having non-planar configurations (e.g., finned or nanowire/nanoribbon configurations), for example. Note that although there is overlap between the replacement material fin 240 and the passivating layer 260, such an overlap may be greater or lesser than the amount shown. Further, in some cases, no overlap may exist, such that the passivating layer 260 and second STI material 222 is etched/recessed 118 to a level that is below the Y interface located between the native material portion of the fin and the replacement material portion. In the case of fabricating transistors having planar configurations, etch 118 may not be performed and the structure shown in FIG. 2H may be used as the integrated circuit structure from which one or more transistors are formed.

Figure 2J:
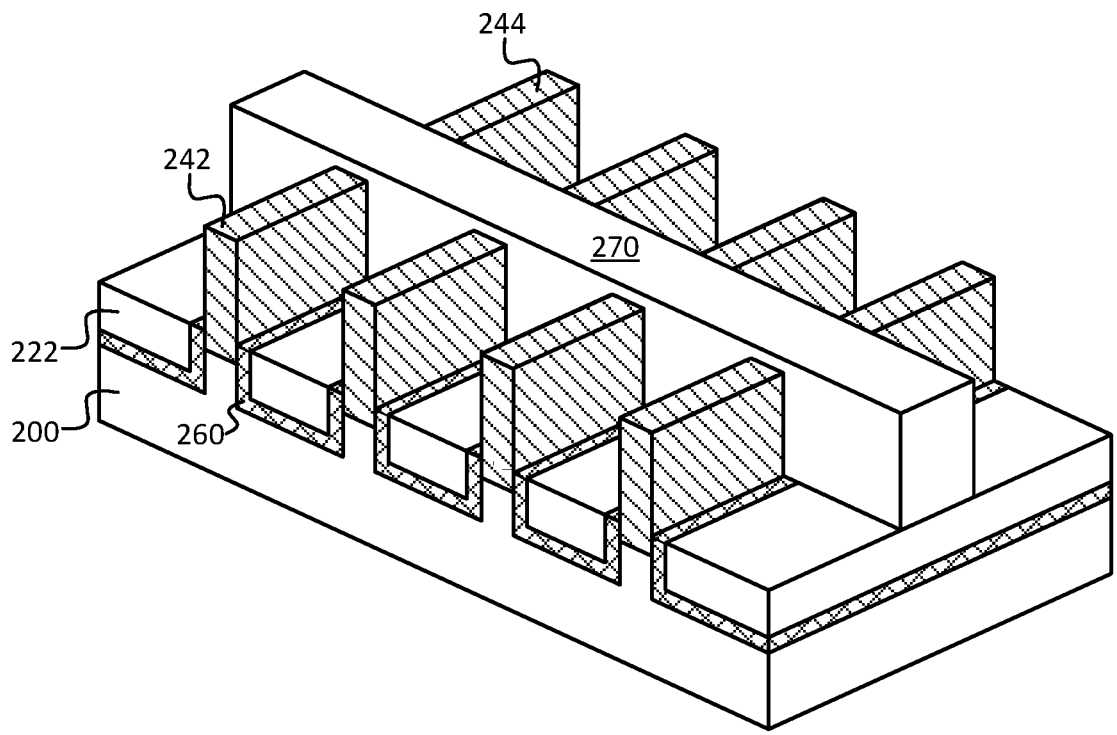
Figure 2K:
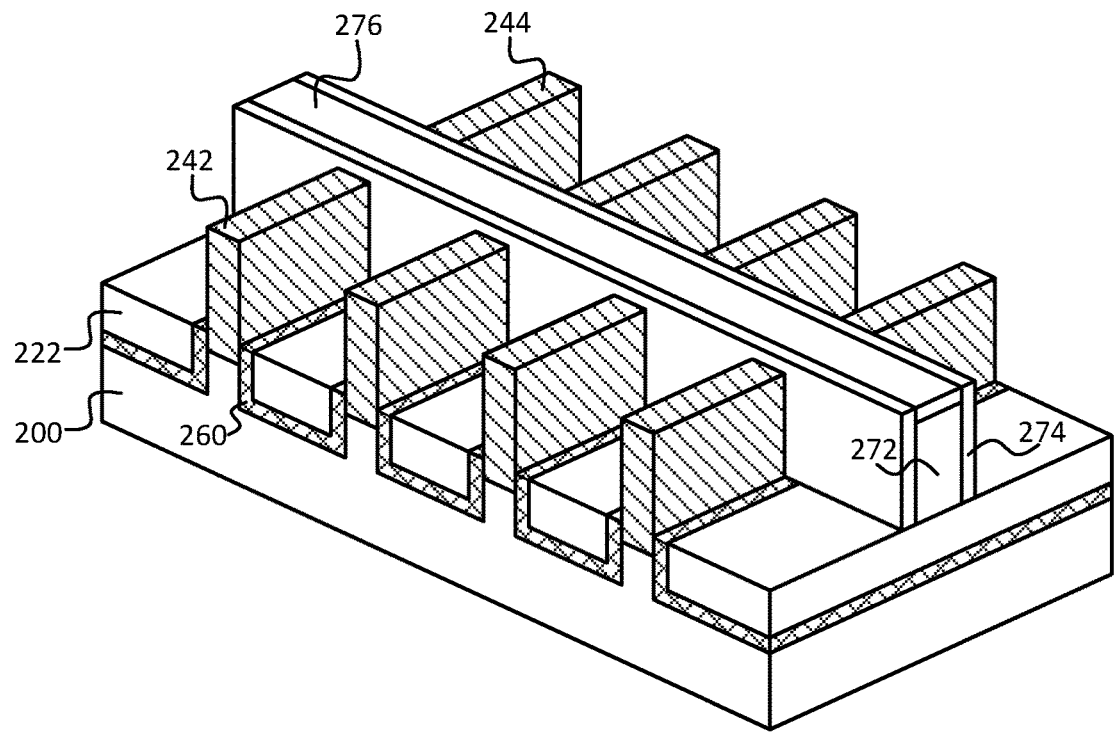
Figure 2K:
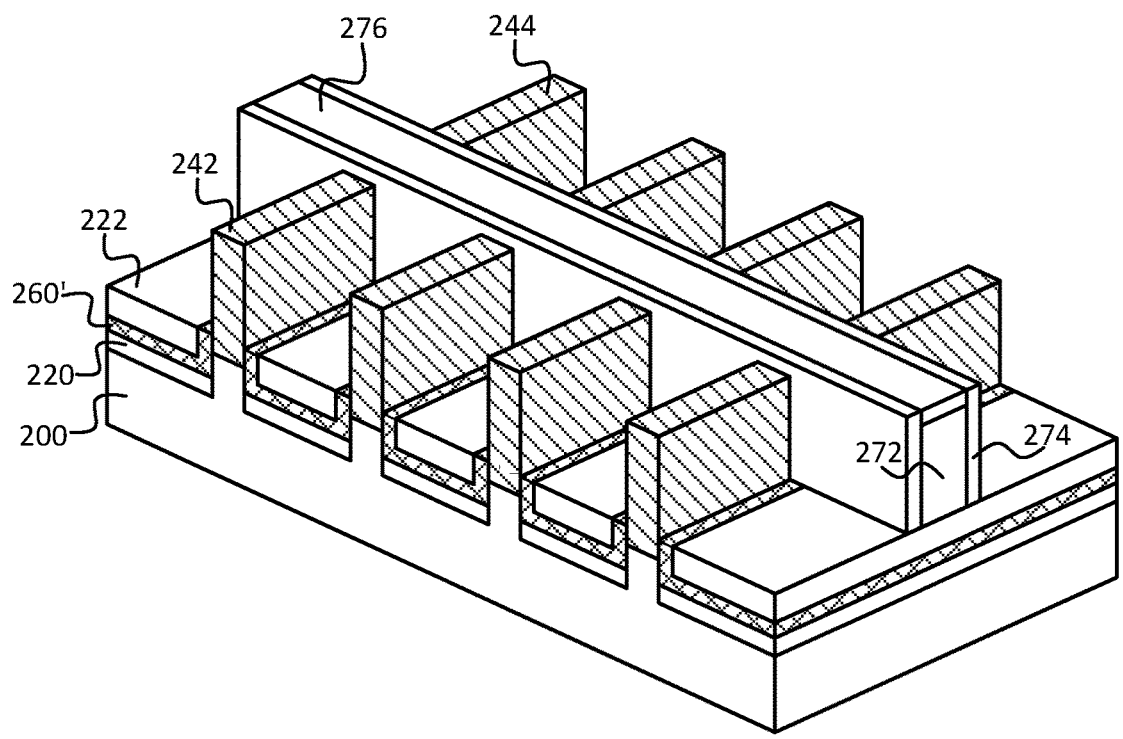
Figure 2L:
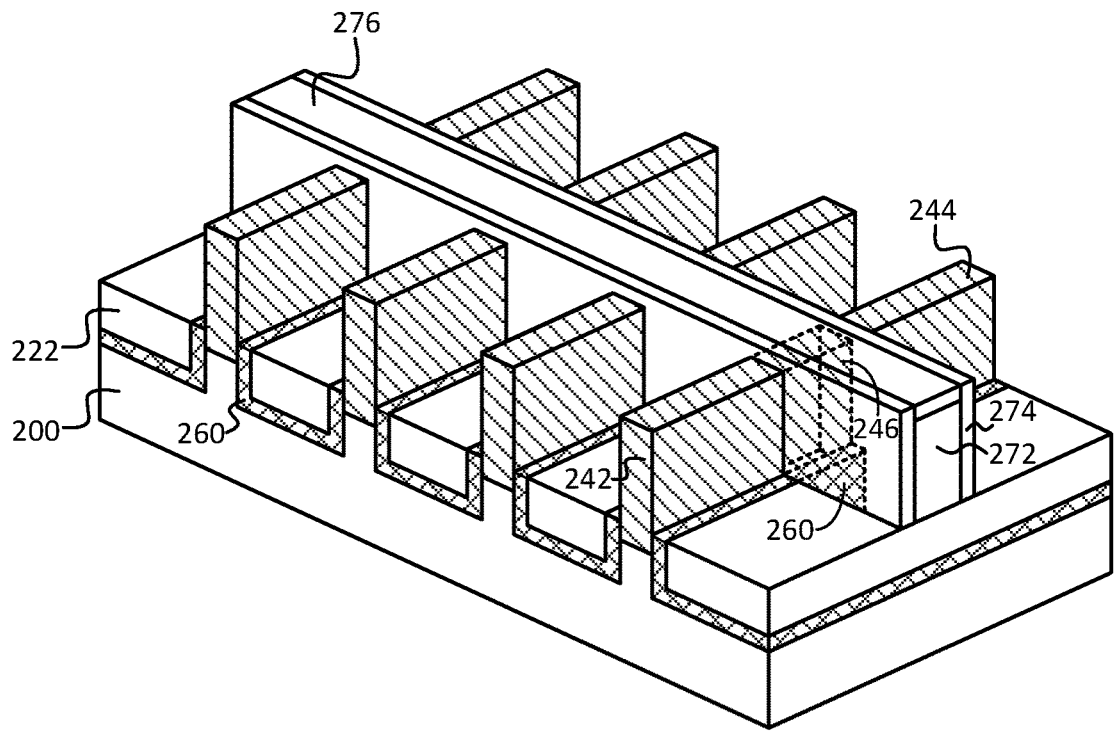

Method 100 of FIG. 1 continues with completing 120 the formation of one or more transistors to form the example resulting structures of FIGS. 2J-L, in accordance with some embodiments. Various different processes can be performed to complete 120 the formation of one or more transistors using the integrated circuit structures of FIGS. 2H (e.g., for planar transistor configurations) and 2I (e.g., for non-planar transistor configurations). Continuing from the structure of FIG. 2I, some such processes may include forming a gate stack 270 on the replacement material fins 240, to form the resulting example structure shown in FIG. 2J, in accordance with an embodiment. In some embodiments, the formation of gate stack 270 may include dummy gate oxide deposition, dummy gate electrode (e.g., poly-Si) deposition, and patterning hardmask deposition. Additional processing may include patterning the dummy gates and depositing/etching spacer material. Following such processes, the method may continue with insulator deposition, planarization, and then dummy gate electrode and gate oxide removal to expose the channel region of the transistors, such as is done for a replacement metal gate (RMG) process. Following opening the channel region, the dummy gate oxide and electrode may be replaced with, for example, a hi-k dielectric and a replacement metal gate, respectively. Other embodiments may include a standard gate stack formed by any suitable process. Any number of standard back-end processes may also be performed to help complete 120 the formation of one or more transistors.

In the example structure shown in FIG. 2K, the gate stack 270 includes gate electrode 272 and a gate dielectric (not shown for ease of illustration) formed directly under gate electrode 272. The gate dielectric and gate electrode may be formed using any suitable technique and from any suitable materials. For example, the gate stack may have been formed during a replacement metal gate process, as previously described, and such a process may include any suitable deposition technique (e.g., CVD, PVD, etc.). The gate dielectric may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. In general, the thickness of the gate dielectric should be sufficient to electrically isolate the gate electrode from the source and drain contacts. Further, the gate electrode 272 may comprise a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. As can also be seen, spacers 274 may be formed to, for example, protect the gate stack during subsequent processing. A hardmask 276 can also be formed to protect the gate stack form subsequent processing.

The gate stack 270 can be used to define channel regions as well as source and drain regions of subsequently formed transistors, where the channel region is underneath the gate stack and the source/drain (S/D) regions are located on either side of the channel region (in other words, the S/D regions are adjacent to the channel region). For example, the portion of fins 240 underneath gate stack 270 in FIG. 2J can be used for transistor channel regions and the portion of the fins indicated as 242 and 244 on either side of gate stack 270 can be used for transistor S/D regions. Note that 242 can be used either for the source region or the drain region, and 244 can be used for the other region, based on the resulting configuration. Accordingly, once the gate stack is fabricated, the S/D regions 242 and 244 can be processed. The S/D regions 242 and 244 of the fins are formed in the fin regions on either side of the gate stack, as normally done (e.g., ion implantation, or etch and deposition and in situ doping, or any other suitable source/drain forming process). Contacts may be formed on those source/drain regions using, for example, a silicidation process (generally, deposition of contact metal and subsequent annealing). Typical S/D region materials include, for example, Si, SiGe, Ge, and/or III-V compounds, to name a few example materials, which can be doped as needed to provide the desired polarity. Example source drain contact materials include, for example, tungsten, titanium, silver, gold, aluminum, copper, cobalt, and alloys thereof.

FIG. 2K' is provided to illustrate an alternative example structure where the first STI material 220 is not completely removed during etch 112, in accordance with an embodiment. As was previously described, in some cases, etch 112 may be a partial etch that leaves some of the first STI material 220 in the STR trenches. In such an example case, the passivation layer 260' is deposited on the recessed first STI material 220 in the STR trenches as opposed to being directly deposited on substrate 200 (e.g., compare the structure of FIG. 2K' with the structure of FIG. 2K). Note that passivation layer 260' is similar to passivation layer 260 as variously described herein, except that passivation layer 260' is deposited on the structure that includes first STI material 220, as just described. Such an example structure that retains a portion of the first STI material 220 and forms passivating layer 260' as a sandwiched structure between the first and second STI materials 220 and 222 may be utilized as desired depending on the end use or target application.

FIG. 2L is provided to illustrate one of the channel regions 246 under the gate, in accordance with an example embodiment. As can be seen in the example structure of FIG. 2L, the original finned configuration was maintained in channel region 246. However, the structure of FIG. 2L may also be achieved by replacing the channel region with a finned structure during a replacement gate process (e.g., an RMG process). In such finned configurations, which are also referred to as tri-gate and fin-FET configurations, there are three effective gates—two on either side and one on top—as is known in the field. As can also be seen in FIG. 2L, the channel region includes a first portion having sides in contact with the gate (the upper portion in this example case) and a second portion having sides in contact with the passivating layer 260. The second portion is sometimes referred to as the sub-fin portion and such a portion typically is in contact with STI material. However, as a result of the passivation techniques described herein, passivation layer 260 is included on both sides of this sub-fin portion, providing the benefits variously described herein (e.g., reduction in density of interface traps, reduction in source-to-drain leakage, etc.).

As will be apparent in light of the present disclosure, suitable doping may be performed in the channel and/or S/D regions depending on the material(s) in those regions and the desired end use or target application. For example, channel regions comprising Si or at least one III-V material may be p-type doped (e.g., to form an n-MOS transistor) and channel regions comprising SiGe and/or Ge may be n-type doped (e.g., to form a p-MOS transistor). In some embodiments, n-MOS and p-MOS transistors may be combined to form CMOS devices, for example. Doping, as variously described herein, may be performed using any suitable techniques and dopants, depending, for example, upon the material being doped, the desired n-type or p-type doping result, and/or the target application. Numerous different doping schemes will be apparent in light of the present disclosure. Note that the processes 102-120 of method 100 are shown in a particular order in FIG. 1 for ease of description. However, one or more of the processes 102-120 may be performed in a different order or may not be performed at all. For example, box 118 is an optional process that may not be performed if the resulting desired transistor architecture is planar. Numerous variations on method 100 will be apparent in light of the present disclosure.

Figure 3B:
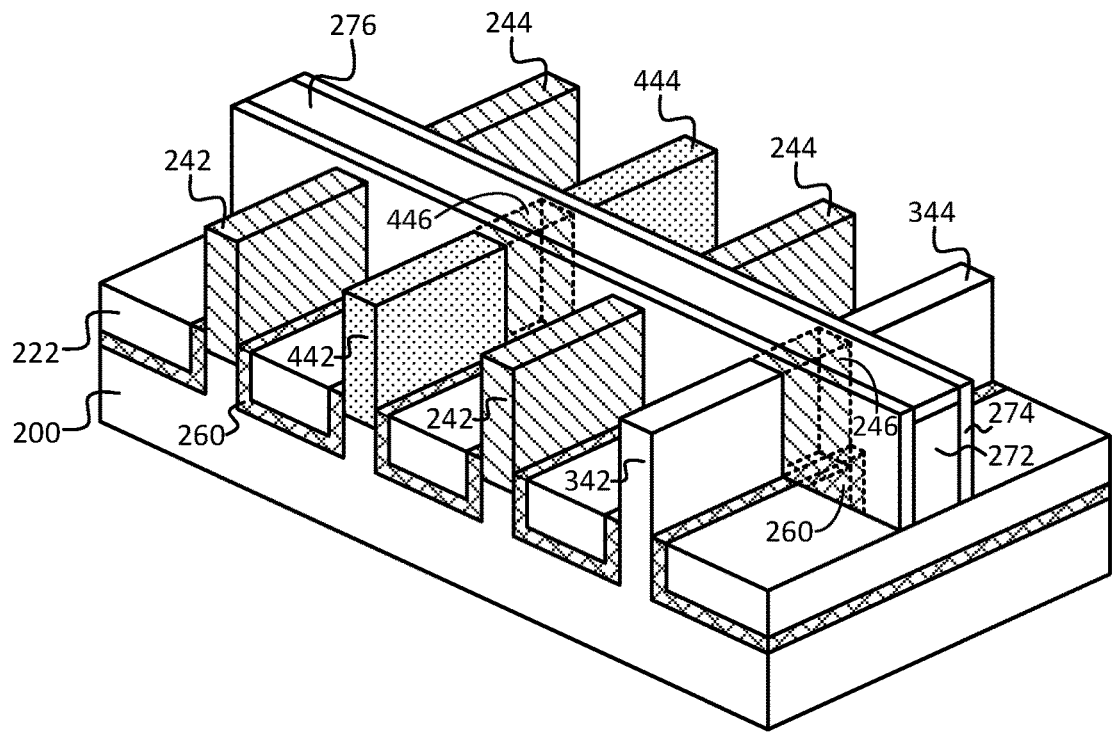
Figure 3C:
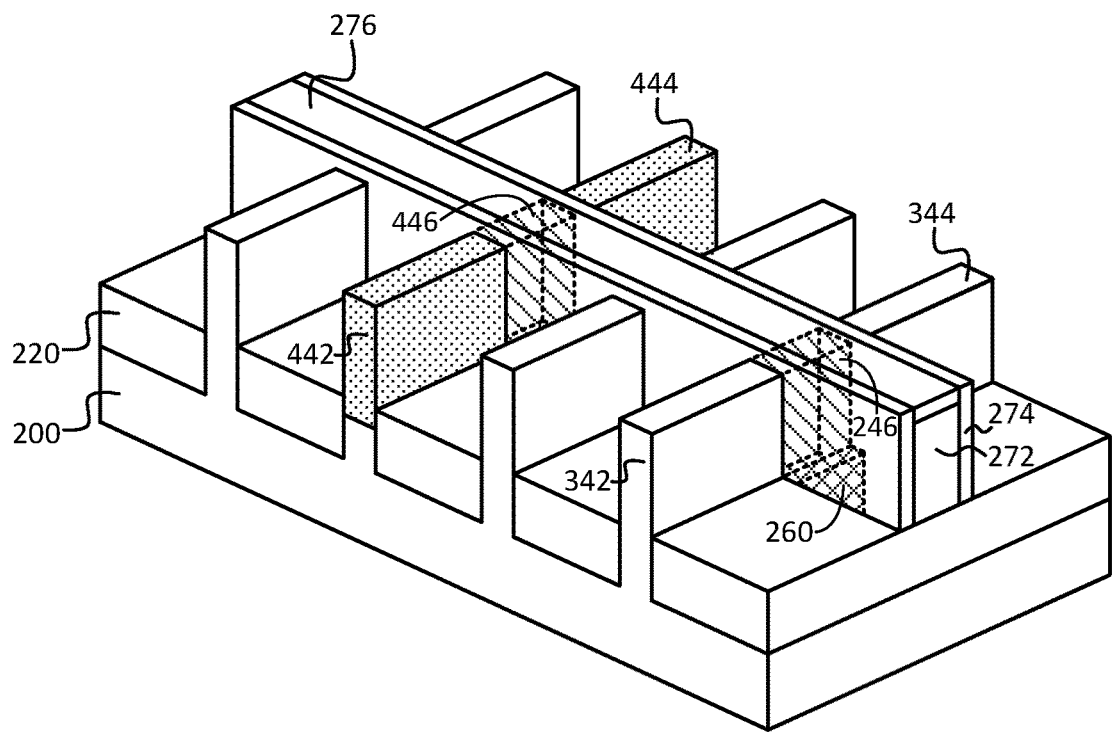

FIGS. 3A-C illustrate variations on the structure of FIG. 2L formed using the method 100 of FIG. 1, in accordance with some embodiments. More specifically, FIG. 3A is provided to illustrate an integrated circuit structure including transistors having nanowire configurations. As can be seen the channel region of the foremost (or right-most) fin in the structure of FIG. 2L was formed into two nanowires 346. A nanowire transistor (sometimes referred to as a gate-all-around or nanoribbon transistor) is configured similarly to a fin-based transistor, but instead of a finned channel region where the gate is on three sides (and thus, there are three effective gates), one or more nanowires are used and the gate material generally surrounds each nanowire on all sides. Depending on the particular design, some nanowire transistors have, for example, four effective gates. As can be seen in the example structure of FIG. 3A, the channel regions each have two nanowires 346, although other embodiments can have any number of nanowires. The nanowires 346 may have been formed while the channel regions were exposed during a replacement gate process (e.g., an RMG process), after the dummy gate is removed, for example. Note that any combination of transistor configurations may be used for a single integrated circuit, including planar, dual gate, finned (or tri-gate or FinFET), nanowire (or nanoribbon or gate-all-around), and/or any other suitable transistor configuration, depending on the end use or target application.

FIG. 3B is provided to illustrate additional variations in the integrated circuit structure of FIG. 2L, in accordance with some embodiments. As can be seen in FIG. 3B, only the channel portion of the right-most fin was replaced by replacement material 240, resulting in the same channel region 246 as shown in FIG. 2L, with S/D regions 342 and 344 comprising native substrate material (and extending from the substrate, as shown). The benefits of the passivating layer 260 variously described herein can still be achieved in such a configuration, as the passivation layer 260 is used to passivate the replacement material in a transistor channel region, which is still the case with channel region 246. Similarly, the second left-most fin illustrates that the S/D regions can be replaced/epitaxially grown (forming S/D regions 442 and 444), yet the benefits of the passivating layer 260 variously described herein can still be achieved, as the passivating layer 260 is still providing passivation to the corresponding replacement channel region 446. FIG. 3C is provided to illustrate an example integrated circuit structure where the passivation techniques are performed only in the channel region during a replacement gate process, in accordance with some embodiments. As can be seen in the right-most fin in such an example case, the passivating layer 260 is only located in the channel region 246, as it was deposited only in that region prior to the deposition of the replacement gate. Accordingly the S/D regions of the fin 342 and 344 comprise native substrate material (and extend from the substrate, as shown). Moreover, the first STI material 220 was only replaced in the channel region, leaving the first STI material surrounding the S/D regions. In this example structure, one or more of the S/D regions may be replaced/epitaxially grown, as the second left-most fin S/D regions 442 and 444 were. The passivation techniques variously described herein have applicability to many different configurations, such as for transistors formed using an ART process with a replacement channel region. Numerous variations and configurations will be apparent in light of the present disclosure.

Example System

Figure 4:
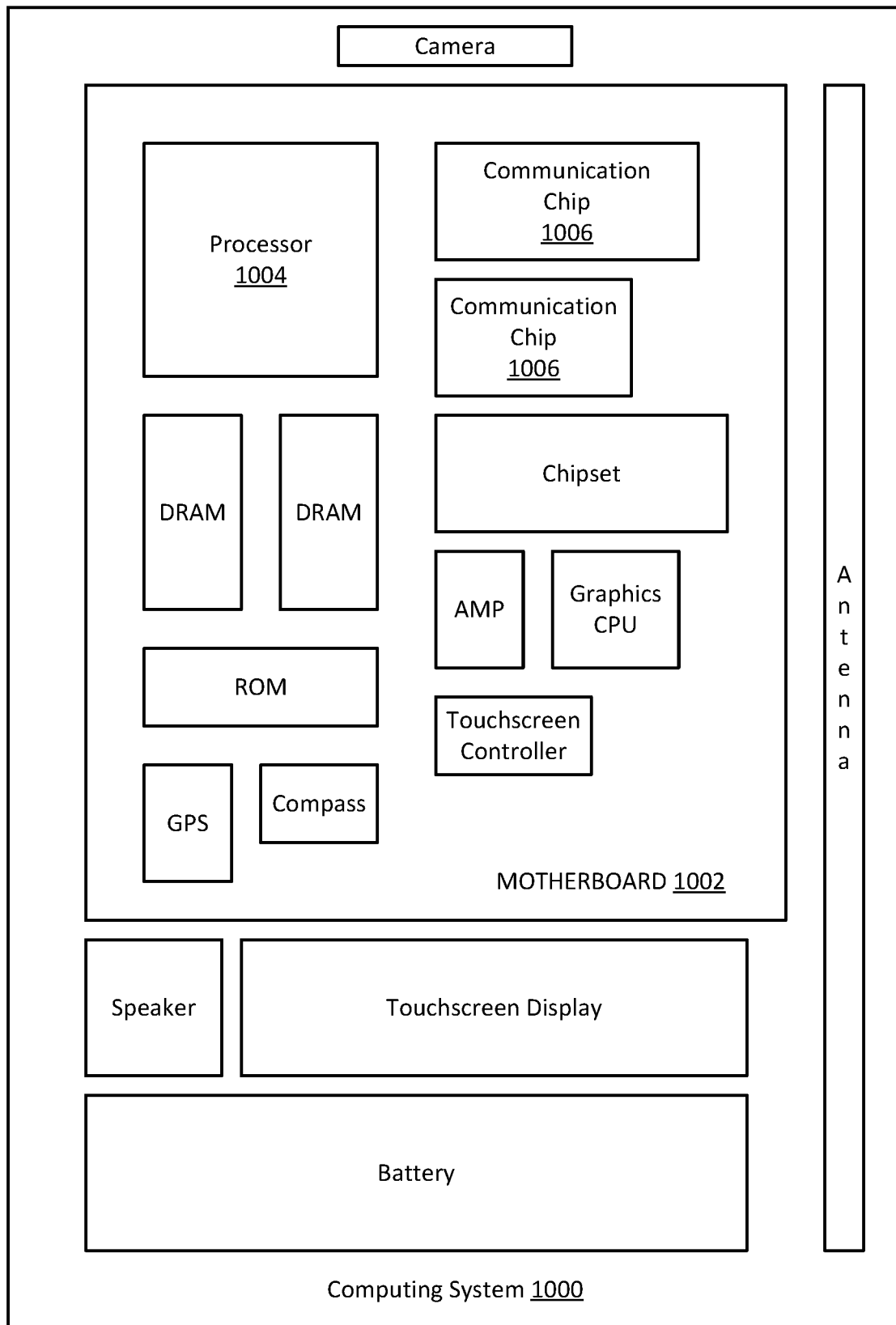
FIG. 4 illustrates a computing system implemented with integrated circuit structures or devices formed using the techniques disclosed herein, in accordance with an embodiment of the present disclosure.

FIG. 4 illustrates a computing system 1000 implemented with integrated circuit structures or devices formed using the techniques disclosed herein, in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit including: a substrate comprised of a substrate material; a transistor channel region comprised of a replacement material different than the substrate material, the channel region located on a portion of the substrate and under a gate, wherein the channel region includes a first portion having one or more sides in contact with the gate and a second portion having one or more sides not in contact with the gate; and a layer comprised of a passivating material and located between the second portion of the channel region and shallow trench isolation (STI) material, wherein the passivating material is different than the STI material.

Example 2 includes the subject matter of Example 1, wherein the passivating material layer reduces the density of interface traps in the channel region.

Example 3 includes the subject matter of any of Examples 1-2, wherein the substrate is a bulk silicon substrate.

Example 4 includes the subject matter of any of Examples 1-2, wherein the replacement material is silicon and the passivating material is at least one of silicon dioxide and silicon nitride.

Example 5 includes the subject matter of any of Examples 1-3, wherein the replacement material is one of silicon germanium and germanium and the passivating material is at least one of silicon, aluminum oxide, aluminum nitride, and yttrium.

Example 6 includes the subject matter of any of Examples 1-3, wherein the replacement material includes at least one III-V material and the passivating material is at least one of aluminum oxide, hafnium oxide, sulfur, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Example 7 includes the subject matter of any of Examples 1-6, wherein the passivating material layer has a thickness of 1-10 nm.

Example 8 includes the subject matter of any of Examples 1-7, further including source and drain (S/D) regions adjacent to the channel region, the S/D regions comprised of the substrate material.

Example 9 includes the subject matter of any of Examples 1-7, further including source and drain (S/D) regions adjacent to the channel region, the S/D regions comprised of the replacement material.

Example 10 includes the subject matter of any of Examples 8-9, wherein the passivating material layer is located between the S/D regions and the STI material.

Example 11 includes the subject matter of any of Examples 1-10, wherein the passivating material layer is located between at least a portion of the substrate and the STI material.

Example 12 includes the subject matter of any of Examples 1-11, wherein the STI material is at least one of an oxide, a nitride, and a dielectric material.

Example 13 includes the subject matter of any of Examples 1-12, wherein the transistor geometry includes at least one of a field-effect transistor (FET), metal-oxide-semiconductor FET (MOSFET), tunnel-FET (TFET), planar configuration, finned configuration, Fin-FET configuration, tri-gate configuration, nanowire configuration, and nanoribbon configuration.

Example 14 is a complementary metal-oxide-semiconductor (CMOS) device including the subject matter of any of Examples 1-13.

Example 15 is a computing system including the subject matter of any of Examples 1-14.

Example 16 is a transistor including: a substrate comprised of a substrate material; a channel region comprised of a replacement material different than the substrate material, the channel region located on a portion of the substrate and under a gate, wherein the channel region includes a first portion having one or more sides in contact with the gate and a second portion having one or more sides not in contact with the gate; source and drain (S/D) regions adjacent to the channel region; and a passivating layer comprised of a passivating material and located between the second portion of the channel region and shallow trench isolation (STI) material, the passivating layer further located between at least a portion of the substrate and the STI material and further located between the S/D regions and the STI material, wherein the passivating material is different than the STI material.

Example 17 includes the subject matter of Example 16, wherein the passivating layer reduces the density of interface traps in the channel region.

Example 18 includes the subject matter of any of Examples 16-17, wherein the substrate is a bulk silicon substrate.

Example 19 includes the subject matter of any of Examples 16-17, wherein the replacement material is silicon and the passivating material is at least one of silicon dioxide and silicon nitride.

Example 20 includes the subject matter of any of Examples 16-18, wherein the replacement material is one of silicon germanium and germanium and the passivating material is at least one of silicon, aluminum oxide, aluminum nitride, and yttrium.

Example 21 includes the subject matter of any of Examples 16-18, wherein the replacement material includes at least one III-V material and the passivating material is at least one of aluminum oxide, hafnium oxide, sulfur, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Example 22 includes the subject matter of any of Examples 16-21, wherein the passivating layer has a thickness of 1-10 nm.

Example 23 includes the subject matter of any of Examples 16-22, wherein the S/D regions are comprised of the substrate material.

Example 24 includes the subject matter of any of Examples 16-22, wherein the S/D regions are comprised of the replacement material.

Example 25 includes the subject matter of any of Examples 16-24, wherein the STI material is at least one of an oxide, a nitride, and a dielectric material.

Example 26 includes the subject matter of any of Examples 16-25, wherein the transistor geometry includes at least one of a field-effect transistor (FET), metal-oxide-semiconductor FET (MOSFET), tunnel-FET (TFET), planar configuration, finned configuration, fin-FET configuration, tri-gate configuration, nanowire configuration, and nanoribbon configuration.

Example 27 is a complementary metal-oxide-semiconductor (CMOS) device including the subject matter of any of Examples 16-26.

Example 28 is a computing system including the subject matter of any of Examples 16-27.

Example 29 is a method of forming an integrated circuit, the method including: forming a fin in a substrate, the substrate comprised of a substrate material; depositing a shallow trench isolation (STI) material on both sides of the fin; performing a first etch to at least partially remove the fin and form a trench; depositing replacement material in the trench to form a replacement fin, the replacement material different than the substrate material; performing a second etch to at least partially remove the STI material to expose the replacement fin; applying a passivating layer comprised of a passivating material to the exposed replacement fin; and depositing and planarizing additional STI material on the passivating layer, wherein the passivating material is different than the second STI material.

Example 30 includes the subject matter of Example 29, wherein the second etch completely removes the STI material.

Example 31 includes the subject matter of Example 29, wherein the second etch partially removes the STI material.

Example 32 includes the subject matter of any of Examples 29-31, wherein applying the passivating layer includes depositing the passivating material such that the passivating layer has a thickness of 1-10 nm.

Example 33 includes the subject matter of any of Examples 29-32, wherein applying the passivating material includes treating one or more surfaces of at least a portion of the replacement material to chemically and/or physically alter the one or more surfaces.

Example 34 includes the subject matter of any of Examples 29-33, further including forming a transistor, the transistor including a channel region formed from the replacement material.

Example 35 includes the subject matter of any of Examples 29-34, wherein the STI material and the additional STI material are the same material.

Example 36 includes the subject matter of any of Examples 29-35, wherein depositing the replacement material and applying the passivating layer are performed only in a channel region of a transistor formed on the integrated circuit during a replacement gate process.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit including at least one transistor, the integrated circuit comprising:
   a substrate;
   a semiconductor region including material different from the substrate, the semiconductor region being on a portion of the substrate and under a gate stack, wherein the semiconductor region includes a first portion laterally between portions of the gate stack, and a second portion not laterally between portions of the gate stack;
   a first dielectric region and a second dielectric region, the second portion of the semiconductor region being laterally between the first and second dielectric regions, wherein the first and second dielectric regions include a first dielectric material, wherein both a first surface of the first dielectric region facing the gate stack and an opposite second surface of the first dielectric region include the first dielectric material;
   a first dielectric layer laterally between the second portion of the semiconductor region and the first dielectric region, and not laterally between the first portion of the semiconductor region and the gate stack; and
   a second dielectric layer laterally between the second portion of the semiconductor region and the second dielectric region, and not laterally between the first portion of the semiconductor region and the gate stack, wherein the first and second dielectric layers include a second dielectric material different from the first dielectric material, and wherein a section of the first dielectric layer is between the first dielectric region and the substrate, the section of the first dielectric layer in direct contact with the first dielectric region.

2. The integrated circuit of claim 1, wherein the first and second dielectric layers reduce the density of interface traps in the semiconductor region.

3. The integrated circuit of claim 1, wherein the substrate is a bulk silicon substrate.

4. The integrated circuit of claim 1, wherein the semiconductor region includes one or both of silicon and germanium and the second dielectric material includes one or more of silicon, aluminum, or yttrium.

5. The integrated circuit of claim 1, wherein the semiconductor region includes at least one III-V semiconductor material and the second dielectric material includes one or more of aluminum, hafnium, sulfur, silicon, lanthanum, zirconium, tantalum, titanium, barium, strontium, yttrium, lead, scandium, zinc, or niobium.

6. The integrated circuit of claim 1, wherein the first and second dielectric layers have a thickness of 1-10 nanometers.

7. The integrated circuit of claim 1, further comprising a source region and a drain region, the first portion of the semiconductor region being laterally between the source and drain regions, wherein the source and drain regions include semiconductor material included in the semiconductor region and/or are native to the substrate.

8. The integrated circuit of claim 7, wherein
   the first dielectric layer is also laterally between the source region and the first dielectric region, and laterally between the drain region and the first dielectric region, and
   the second dielectric layer is also laterally between the source region and the second dielectric region, and laterally between the drain region and the second dielectric region.

9. The integrated circuit of claim 1, wherein the first dielectric layer is also between the portion of the substrate and the first dielectric region, and the second dielectric layer is also between the portion of the substrate and the second dielectric region.

10. The integrated circuit of claim 1, wherein the first dielectric material includes one or both of oxygen or nitrogen.

11. The integrated circuit of claim 1, wherein the first portion of the semiconductor region is a fin.

12. A complementary metal-oxide-semiconductor (CMOS) circuit comprising the integrated circuit of claim 1.

13. A computing system comprising the integrated circuit of claim 1.

14. The integrated circuit of claim 1, wherein:
   a section of the second dielectric layer is between the second dielectric region and the substrate, the section of the second dielectric layer in direct contact with the second dielectric region.

15. The integrated circuit of claim 1, wherein a portion of the substrate directly underneath the semiconductor region is laterally between the first and second dielectric regions.

16. The integrated circuit of claim 1, wherein the first portion of the semiconductor region and the second portion of the semiconductor region is doped using dopants having a same conductivity type.

17. The integrated circuit of claim 1, wherein the second dielectric material of the first and second dielectric layers includes oxygen.

18. An integrated circuit including at least one transistor, the integrated circuit comprising:
   a substrate;
   a first semiconductor region including material different from the substrate, the first semiconductor region being on a portion of the substrate and below a gate stack, and including a portion not laterally between portions of the gate stack;
   a second semiconductor region between the first semiconductor region and the gate stack, the gate stack being around the second semiconductor region;
   a first dielectric region and a second dielectric region, the portion of the first semiconductor region being laterally between the first and second dielectric regions, wherein the first and second dielectric regions include a first dielectric material; and
   a first dielectric layer laterally between the portion of the first semiconductor region and the first dielectric region, and a second dielectric layer laterally between the portion of the first semiconductor region and the second dielectric region, wherein the first and second dielectric layers include a second dielectric material different from the first dielectric material, the second dielectric material including oxygen.

19. The integrated circuit of claim 18, wherein the first semiconductor region includes at least one III-V semiconductor material or germanium and the first and second dielectric layers include one or more of silicon, aluminum, yttrium, hafnium, sulfur, lanthanum, zirconium, tantalum, titanium, barium, strontium, lead, scandium, zinc, or niobium.

20. An integrated circuit including at least one transistor, the integrated circuit comprising:
   a substrate;
   a semiconductor region including material different from the substrate, the semiconductor region being above a portion of the substrate and under a gate stack, wherein a first portion of the semiconductor region is laterally between portions of the gate stack, and a second portion of the semiconductor region is not laterally between portions of the gate stack;
   a first dielectric region and a second dielectric region, the first and second dielectric regions including a first dielectric material, the second portion of the semiconductor region being laterally between the first and second dielectric regions; and
   a first dielectric layer between the portion of the substrate and the first dielectric region, and not laterally between the first portion of the semiconductor region and the gate stack, and a second dielectric layer between the portion of the substrate and the second dielectric region, and not laterally between the first portion of the semiconductor region and the gate stack, wherein the first and second dielectric layers include a second dielectric material different from the first dielectric material, and the second dielectric material of the first and second dielectric layers including oxygen.

* * * * *